(12) United States Patent
Ito et al.

(10) Patent No.: US 8,766,297 B2
(45) Date of Patent: Jul. 1, 2014

(54) SEMICONDUCTOR LIGHT EMITTING DEVICE AND METHOD FOR MANUFACTURING SAME

(75) Inventors: Toshihide Ito, Tokyo (JP); Toshiyuki Oka, Kanagawa-ken (JP); Kotaro Zaima, Tokyo (JP); Taisuke Sato, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/030,264

(22) Filed: Feb. 18, 2011

(65) Prior Publication Data
US 2012/0043550 A1 Feb. 23, 2012

(30) Foreign Application Priority Data
Aug. 17, 2010 (JP) .................. 2010-182379

(51) Int. Cl.
*H01L 33/36* (2010.01)
*H01L 33/42* (2010.01)

(52) U.S. Cl.
USPC 257/98; 257/99; 257/E33.068; 257/E33.064; 438/29; 438/22

(58) Field of Classification Search
USPC ........ 257/E33.068, E33.07, E33.069; 438/22, 438/29
See application file for complete search history.

(56) References Cited

U.S. PATENT DOCUMENTS

| 6,784,462 B2 * | 8/2004 | Schubert ................. 257/98 |
| 7,553,685 B2 * | 6/2009 | Noto et al. ............... 438/46 |
| 2006/0273335 A1 | 12/2006 | Asahara et al. |
| 2007/0018184 A1 | 1/2007 | Beeson et al. |
| 2008/0217634 A1 * | 9/2008 | Liu et al. .................. 257/98 |
| 2010/0200884 A1 * | 8/2010 | Lee et al. ................. 257/98 |
| 2011/0089452 A1 * | 4/2011 | Jeong et al. .............. 257/98 |
| 2011/0151606 A1 * | 6/2011 | Jeong et al. .............. 438/29 |

FOREIGN PATENT DOCUMENTS

| JP | 2002-64221 A | 2/2002 |
| JP | 2005-513787 | 5/2005 |

(Continued)

OTHER PUBLICATIONS

U.S. Appl. No. 13/030,453, filed Feb. 18, 2011, Ito, et al.
U.S. Appl. No. 13/037,687, filed Mar. 1, 2011, Zaima, et al.
Japanese Office Action issued Oct. 23, 2012 in Patent Application No. 2010-182379 with English Translation.

(Continued)

*Primary Examiner* — Matthew W Such
*Assistant Examiner* — Scott Stowe
(74) *Attorney, Agent, or Firm* — Oblon, Spivak, McClelland, Maier & Neustadt, L.L.P.

(57) ABSTRACT

According to one embodiment, a semiconductor light emitting device includes a stacked structural body, first and second electrodes, a high resistance layer and a transparent conductive layer. The stacked structural body includes first and second semiconductor layers and a light emitting layer. The first semiconductor layer is disposed between the first electrode and the second semiconductor layer. The second semiconductor layer is disposed between the second electrode and the first semiconductor layer. The second electrode has reflectivity with respect to luminescent light. The high resistance layer is in contact with the second semiconductor layer between the second semiconductor layer and the second electrode and includes a portion overlapping with the first electrode. The transparent conductive layer is in contact with the second semiconductor layer between the second semiconductor layer and the second electrode. The transparent conductive layer has a resistance lower than a resistance of the high resistance layer.

19 Claims, 12 Drawing Sheets

(56) References Cited

FOREIGN PATENT DOCUMENTS

| JP | 2008-192710 A | 8/2008 |
| JP | 2008-218878 | 9/2008 |
| JP | 2009-27175 | 2/2009 |
| JP | 2010-40761 | 2/2010 |
| WO | WO 2006/006555 A1 | 1/2006 |
| WO | WO 2006/080958 A1 | 8/2006 |

OTHER PUBLICATIONS

Japanese Office Action issued Jan. 11, 2013, in Patent Application No. 2010-182379 (with English-language translation).

Japanese Office Action issued Jul. 25, 2012, in Japan Patent Application No. 2010-182379 (with English translation).

* cited by examiner

SEMICONDUCTOR LIGHT EMITTING DEVICE AND METHOD FOR MANUFACTURING SAME

CROSS-REFERENCE TO RELATED APPLICATIONS

This application is based upon and claims the benefit of priority from the prior Japanese Patent Application No. 2010-182379, filed on Aug. 17, 2010; the entire contents of which are incorporated herein by reference.

FIELD

Embodiments described herein relate generally to a semiconductor light emitting device and a method for manufacturing the same.

BACKGROUND

Improvement in the efficiency of semiconductor light emitting devices such as light emitting diodes (LED) is desired. In order to improve efficiency, improving an extraction efficiency of light emitted from a light emitting layer of the semiconductor light emitting device is important.

An example of such a configuration exists wherein a semiconductor light emitting device includes a transparent electrode that is in ohmic contact with a surface of a contact layer and that substantially covers an entirety of the surface of this contact layer; and a metal reflection film disposed so as to substantially face an entirety of this transparent electrode.

There is still room for further improvement of light extraction efficiency.

DETAILED DESCRIPTION

Figure 1A:
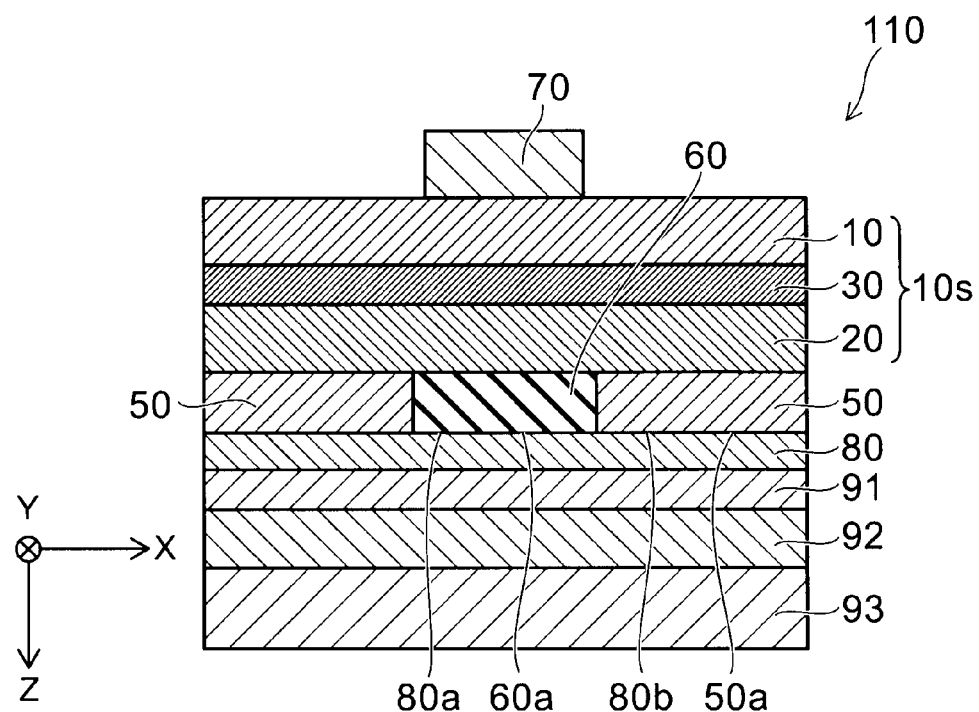
FIG. 1A and FIG. 1B are schematic views illustrating a semiconductor light emitting device according to an embodiment.

In general, according to one embodiment, a semiconductor light emitting device includes a stacked structural body, a first electrode, a second electrode, a high resistance layer and a transparent conductive layer. The stacked structural body includes a first semiconductor layer of a first conductivity type, a second semiconductor layer of a second conductivity type, and a light emitting layer provided between the first semiconductor layer and the second semiconductor layer. The first semiconductor layer is disposed between the first electrode and the second semiconductor layer. The second semiconductor layer is disposed between the second electrode and the first semiconductor layer. The second electrode has reflectivity with respect to luminescent light emitted from the light emitting layer. The high resistance layer is in contact with the second semiconductor layer between the second semiconductor layer and the second electrode. The high resistance layer includes a portion overlapping with the first electrode when viewed along a first direction from the first semiconductor layer toward the second semiconductor layer. The high resistance layer has a resistance higher than a resistance of the second semiconductor layer. The transparent conductive layer is in contact with the second semiconductor layer between the second semiconductor layer and the second electrode. The transparent conductive layer is transparent with respect to the luminescent light. The transparent conductive layer has a refractive index lower than a refractive index of the second semiconductor layer. The transparent conductive layer has a resistance lower than a resistance of the high resistance layer.

Various embodiments will be described hereinafter with reference to the accompanying drawings.

Note that the drawings are schematic or simplified illustrations and that relationships between thicknesses and widths of parts and proportions in size between parts may differ from actual parts. Also, even where identical parts are depicted, mutual dimensions and proportions may be illustrated differently depending on the drawing.

Note that in the drawings and specification of this application, the same numerals are applied to elements that have already appeared in the drawings and been described, and repetitious detailed descriptions of such elements are omitted.

First Embodiment

Figure 1B:
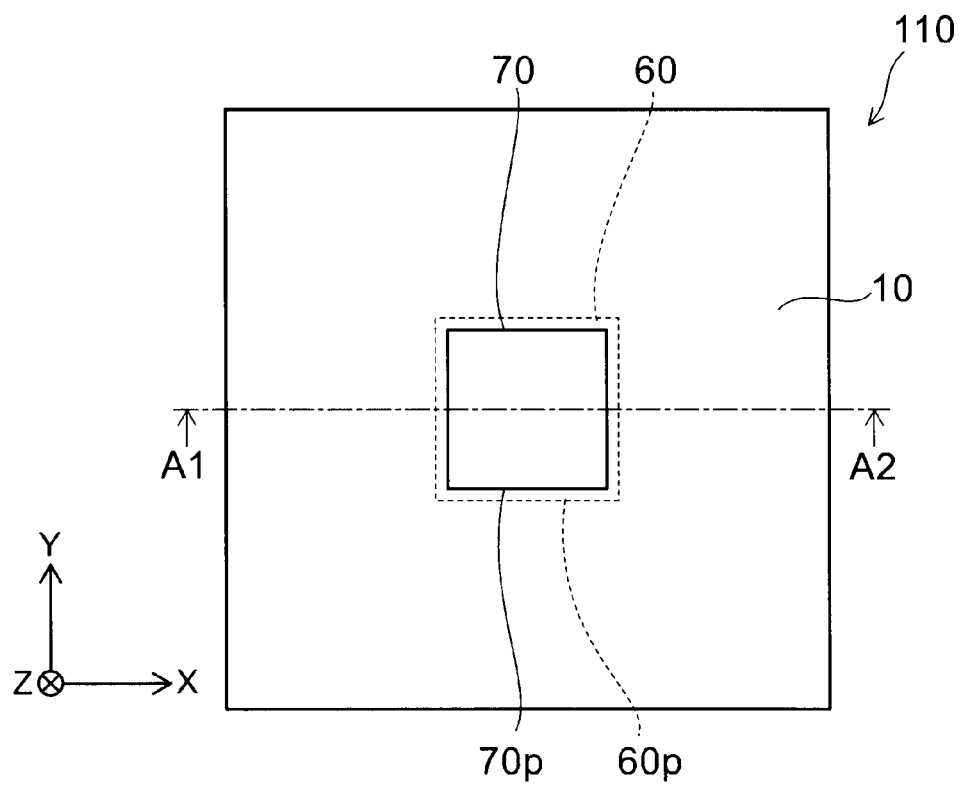

FIG. 1A and FIG. 1B are schematic views illustrating the configuration of a semiconductor light emitting device according to a first embodiment.

Specifically, FIG. 1B is a schematic plan view and FIG. 1A is a cross-sectional view taken across line A1-A2 of FIG. 1B.

As illustrated in FIG. 1A and FIG. 1B, a semiconductor light emitting device 110 according to the embodiment includes a stacked structural body 10s, a first electrode 70, a second electrode 80, a high resistance layer 60, and a transparent conductive layer 50.

The stacked structural body 10s includes a first semiconductor layer 10 of a first conductivity type, a second semiconductor layer 20 of a second conductivity type, and a light emitting layer 30 provided between the first semiconductor layer 10 and the second semiconductor layer 20.

The first semiconductor layer 10, the second semiconductor layer 20, and the light emitting layer 30 include nitride semiconductors, for example.

For example, the first conductivity type is an n-type and the second conductivity type is a p-type. However, this embodiment is not limited thereto, and the first conductivity type may be the p-type and the second conductivity type may be the n-type. Hereafter, a case in which the first conductivity type is the n-type, and the second conductivity type is the p-type will be described.

Here, a direction from the first semiconductor layer 10 toward the second semiconductor layer 20 is defined as a Z-axis direction (first direction). A direction perpendicular to the Z-axis direction is defined as an X-axis direction (second direction). A direction perpendicular to the Z-axis direction and perpendicular to the X-axis direction is defined as a Y-axis direction (third direction).

As such, the first semiconductor layer 10, the light emitting layer 30, and the second semiconductor layer 20 are stacked along the Z-axis direction. Here, in this specification, the term "stacked" includes cases where constituents are stacked so that they are in contact with each other and also cases where constituents are stacked by inserting other layers therebetween.

An example of a configuration of the light emitting layer 30 will follow.

The first electrode 70 is provided on a side of the first semiconductor layer 10 opposite to the second semiconductor layer 20. The first semiconductor layer 10 is disposed between the first electrode 70 and the second semiconductor layer 20. The first electrode 70 is in contact with the first semiconductor layer 10. The first electrode 70 may be electrically connected to the first semiconductor layer 10.

The second electrode 80 is provided on a side of the second semiconductor layer 20 opposite to the first semiconductor layer 10. The second semiconductor layer 20 is disposed between the second electrode 80 and the first semiconductor layer 10. The second electrode 80 has reflectivity with respect to luminescent light emitted from the light emitting layer 30. The second electrode 80 is electrically connected to the second semiconductor layer 20 via at least the transparent conductive layer 50.

The high resistance layer 60 is in contact with the second semiconductor layer 20 between the second semiconductor layer 20 and the second electrode 80. The high resistance layer 60 has a portion that overlaps with the first electrode 70 when viewed along the Z-axis direction from the first semiconductor layer 10 toward the second electrode 80. The high resistance layer 60 has a resistance higher than a resistance of the second semiconductor layer 20. For example, an insulating material may be used for the high resistance layer 60. For example, silicon oxide and the like may be used for the high resistance layer 60.

In this example, a planar shape of the first electrode 70 (shape when viewed along the Z-axis direction) is rectangular (i.e. a rectangle) and a planar shape of the high resistance layer 60 (shape when viewed along the Z-axis direction) is rectangular (i.e. a rectangle), but this embodiment is not limited thereto. The first electrode 70 and the high resistance layer 60 may be any desired polygonal shape and may have a desired shape for a back shape including curved profiles including flat-circular and circular shapes.

The transparent conductive layer 50 is in contact with the second semiconductor layer 20 between the second semiconductor layer 20 and the second electrode 80. For example, the transparent conductive layer 50 is juxtaposed with the high resistance layer 60 in a plane perpendicular to the Z-axis direction (X-Y plane). The transparent conductive layer 50 is transparent with respect to the luminescent light and has a refractive index lower than a refractive index of the second semiconductor layer 20. The transparent conductive layer 50 has a lower resistance than the resistance of the high resistance layer 60.

The transparent conductive layer 50 includes an oxide having, for example, at least one element selected from the group consisting of In, Sn, Zn, and Ti. Indium tin oxide (ITO) may be used, for example, as the transparent conductive layer 50. The refractive index of the transparent conductive layer 50 is, for example, not less than 1.80 and not more than 2.20. On the other hand, a GaN layer may be used, for example, as the second semiconductor layer 20. The refractive index of the second semiconductor layer 20 is, for example, not less than 2.15 and not more than 2.70.

In this example, the semiconductor light emitting device 110 further includes a conductive substrate 93 provided on a side of the second electrode 80 opposite to the second semiconductor layer 20, a first conductive layer 91 (a first conductive layer portion) provided between the conductive substrate 93 and the second electrode 80, and a second conductive layer 92 (a second conductive layer portion) provided between the conductive substrate 93 and the first conductive layer 91. The conductive substrate 93 is electrically connected to the second electrode 80. A silicon substrate or the like may be used, for example, for the conductive substrate 93. The first conductive layer 91 and the second conductive layer 92 have, for example, a function to bond the second electrode 80 and the conductive substrate 93. Various metal layers may be used for the first conductive layer 91 and the second conductive layer 92.

Thus, the semiconductor light emitting device 110 may further include the conductive substrate 93 and the conductive layers (the first conductive layer 91 and the second conductive layer 92) provided between the second electrode 80 and the conductive substrate 93. The second electrode 80 is disposed between the conductive substrate 93 and the second semiconductor layer 20.

By providing the conductive substrate 93, heat generated during operation in the stacked structural body 10s can be efficiently transferred to the conductive substrate 93 and be efficiently dissipated. Thereby, the luminous efficacy of the light emitting layer 30 can be improved.

The light emitting layer 30 has a single quantum well (SQW) structure or a multi quantum well (MQW) structure.

Figure 2A:
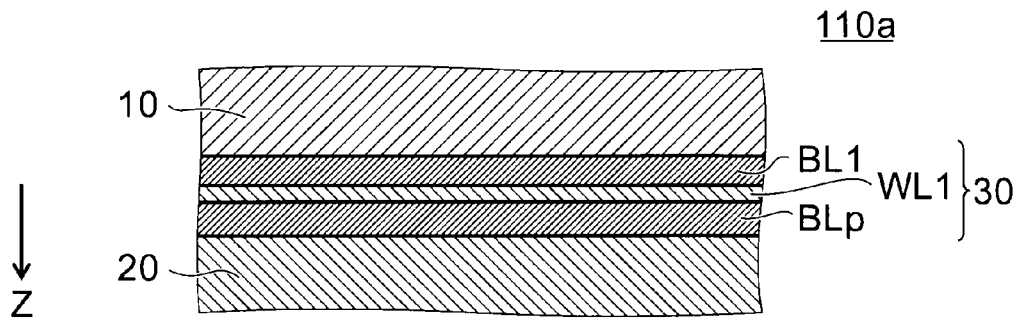
FIG. 2A to FIG. 2C are schematic cross-sectional views illustrating portions of the semiconductor light emitting device according to the embodiment.
Figure 2B:
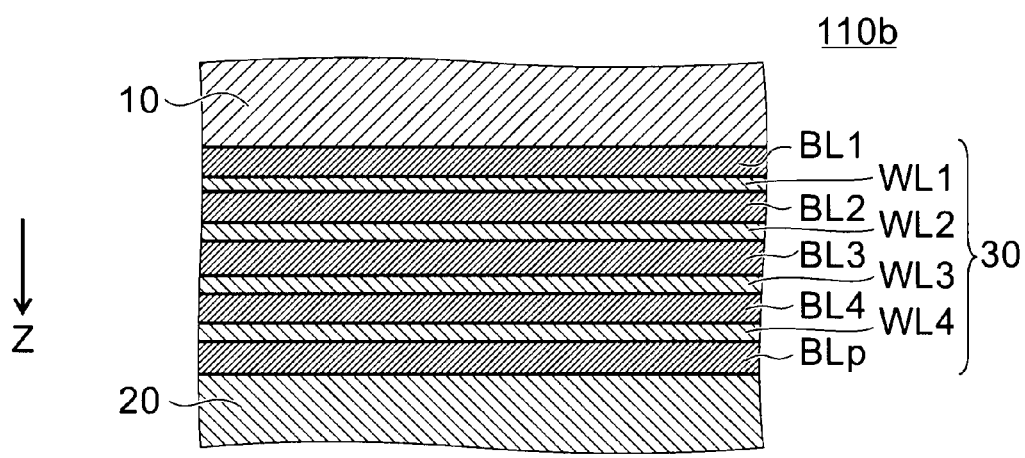
Figure 2C:
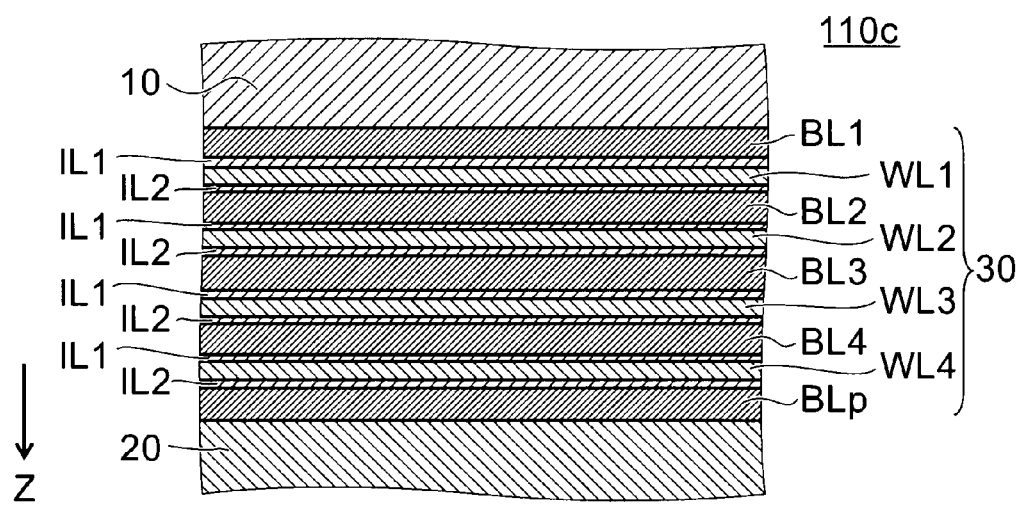

FIG. 2A to FIG. 2C are schematic cross-sectional views illustrating portions of configurations of the semiconductor light emitting device according to the first embodiment.

Specifically, these figures are schematic views illustrating examples of configurations of the light emitting layer 30.

As illustrated in FIG. 2A, in a semiconductor light emitting device 110a according to the embodiment, the light emitting layer 30 has a SQW structure. Specifically, the light emitting layer 30 includes a first barrier layer BL1, a p-side barrier layer BLp, and a first well layer WL1 provided between the first barrier layer BL1 and the p-side barrier layer BLp.

Another layer may be provided between the first barrier layer BL1 and the first well layer WL1 and between the first well layer WL1 and the p-side barrier layer BLp.

As illustrated in FIG. 2B, in a semiconductor light emitting device 110b according to the embodiment, the light emitting layer 30 has a MQW structure. Specifically, the light emitting layer 30 includes a plurality of barrier layers stacked along the Z-axis direction (first to fourth barrier layers BL1 to BL4 and p-side barrier layer BLp) and well layers (first to fourth well layers WL1 to WL4) provided between each of the plurality of barrier layers. In this example, four layers of the well layers are provided, but the number of well layers may be modified as desired.

Thus, the light emitting layer 30 further includes an Nth barrier layer provided on a side of an (N−1)th well layer WL opposite to an (N−1)th barrier layer (wherein N is an integer greater than or equal to 2), and an Nth well layer provided on a side of the Nth barrier layer opposite to an (N−1)th well layer.

As illustrated in FIG. 2C, in a semiconductor light emitting device 110c according to the embodiment, the light emitting layer 30 further includes intermediate layers provided between each of the barrier layers and the well layers. Specifically, the light emitting layer 30 includes a first intermediate layer IL1 provided between the (N−1)th barrier layer and the (N−1)th well layer, and a second intermediate layer IL2 provided between the (N−1)th well layer and the Nth barrier layer. Furthermore, the second intermediate layer IL2 is provided between the Nth well layer and the p-side barrier layer BLp. The first intermediate layer IL1 and the second intermediate layer IL2 may be provided or omitted as necessary. Additionally, the first intermediate layer IL1 may be provided and the second intermediate layer IL2 may be omitted. Additionally, the second intermediate layer IL2 may be provided and the first intermediate layer IL1 may be omitted.

$In_{x1}Al_{y1}Ga_{1-x1-y1}N$ ($0 \leq x1 < 1$, $0 \leq y1 < 1$, $x1+y1 \leq 1$) may, for example, be used for the barrier layers (i.e. the first to fourth barrier layers BL1 to BL4 and the Nth barrier layer). Additionally, $In_{0.02}Al_{0.33}Ga_{0.65}N$ may, for example, be used for the barrier layers. A thickness of the barrier layers may, for example, be 12.5 nm.

$In_{x2}Al_{y2}Ga_{1-x2-y2}N$ ($0 \leq x2 < 1$, $0 \leq y2 < 1$, $x2+y2 \leq 1$) may, for example, be used for the p-side barrier layer BLp. Additionally, $In_{0.02}Al_{0.33}Ga_{0.65}N$ may, for example, be used for the p-side barrier layer BLp. A thickness of the barrier layer may, for example, be 12.5 nm.

$In_{x3}Al_{y3}Ga_{1-x3-y3}N$ ($0 < x3 \leq 1$, $0 \leq y3 < 1$, $x3+y3 \leq 1$) may, for example, be used for the well layers (i.e. the first to fourth well layers WL1 to WL4 and the Nth well layer). Additionally, $In_{0.15}Ga_{0.85}N$ may, for example, be used for the well layers. A thickness of the well layers may, for example, be 2.5 nm.

A composition ratio of In (proportion of number of atoms of In among group III elements) included in the well layers is higher than a composition ratio of In (proportion of number of atoms of In among group III elements) included in the barrier layers (the first to fourth barrier layers BL1 to BL4, the Nth barrier layer, and the p-side barrier layer BLp). Thus, a band gap energy in the barrier layers can be made larger than a band gap energy in the well layers.

$In_{x4}Ga_{1-x4}N$ ($0 \leq x4 < 1$) may, for example, be used for the first intermediate layer IL1. Additionally, $In_{0.02}Ga_{0.98}N$ may, for example, be used for the first intermediate layer IL1. A thickness of the first intermediate layer IL1 may, for example, be 0.5 nm.

$In_{x5}Ga_{1-x5}N$ ($0 \leq x5 < 1$) may, for example, be used for the second intermediate layer IL2. Additionally, $In_{0.02}Ga_{0.98}N$ may, for example, be used for the second intermediate layer IL2. A thickness of the second intermediate layer IL2 may, for example, be 0.5 nm.

The composition ratio of In (proportion of number of atoms of In among group III elements) included in the well layers is higher than a composition ratio of In (proportion of number of atoms of In among group III elements) included in the first intermediate layer IL1 and the second intermediate layer IL2. Thus, the band gap energy in the first intermediate layer IL1 and the second intermediate layer IL2 can be made larger than the band gap energy in the well layers.

The first intermediate layer IL1 may also be considered to be a portion of the barrier layers. Additionally, the second intermediate layer IL2 may also be considered to be a portion of the barrier layers. In other words, the well layers and stacked barrier layers may include a plurality of layers having differing compositions.

In the SQW structure illustrated in FIG. 2A, the first intermediate layer IL1 and the second intermediate layer IL2 may be provided. In this case, the first intermediate layer IL1 is provided between the first barrier layer BL1 and the first well layer WL1 and the second intermediate layer IL2 is provided between the first well layer WL1 and the p-side barrier layer BLp.

The above described is an example of a configuration of the light emitting layer 30, but this embodiment is not limited thereto. Materials used for the barrier layers, the p-side barrier layer BLp, the well layers, the first intermediate layer IL1, and the second intermediate layer IL2, along with the thicknesses thereof may be modified in various ways. As described above, the barrier layers, the p-side barrier layer BLp, the well layers, the first intermediate layer IL1, and the second intermediate layer IL2 include nitride semiconductors.

The semiconductor light emitting device 110 may include a light emitting layer 30 with any of the various configurations described above in the descriptions of the semiconductor light emitting devices 110a to 110c.

Figure 3A:
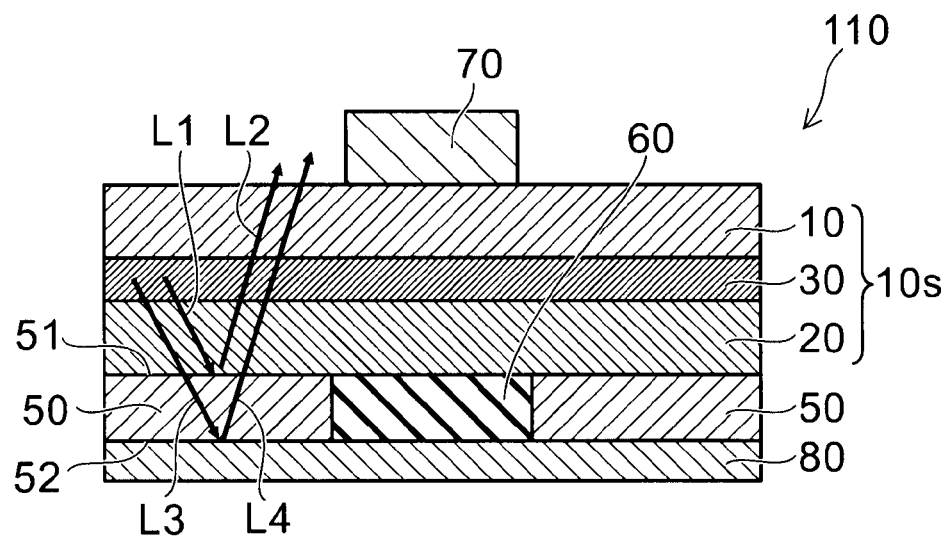
FIG. 3A and FIG. 3B are schematic cross-sectional views illustrating operations of semiconductor light emitting devices.
Figure 3B:
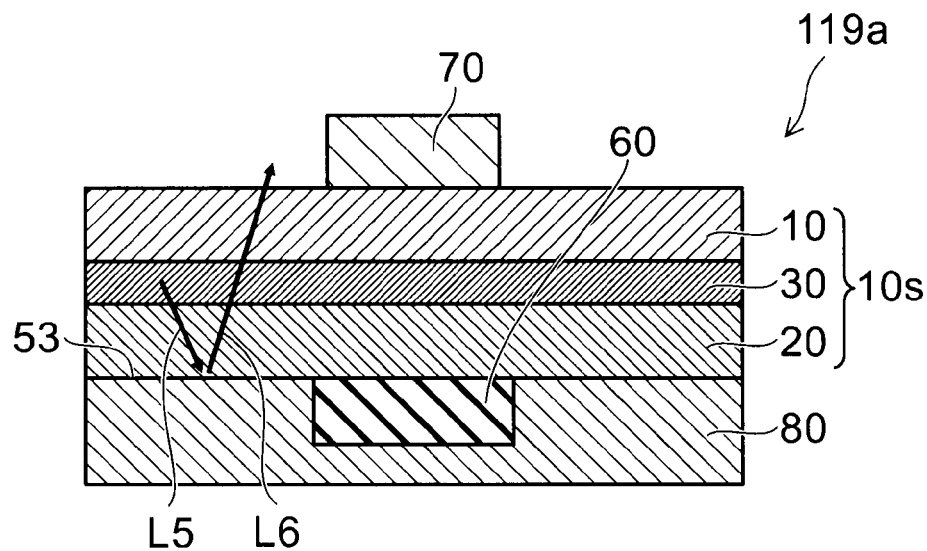

FIG. 3A and FIG. 3B are schematic cross-sectional views illustrating operations of semiconductor light emitting devices. Specifically, FIG. 3A illustrates an optical operation in the semiconductor light emitting device 110 according to the embodiment and FIG. 3B illustrates an optical operation in a semiconductor light emitting device 119a of a first reference example.

As illustrated in FIG. 3B, in the semiconductor light emitting device 119a of the first reference example, the transparent conductive layer 50 is not provided. In this case, a portion of light L5 (light traveling to a side of the second electrode 80) of the luminescent light emitted from the light emitting layer 30 reflects at an interface 53 between the second semiconductor layer 20 and the second electrode 80 and is extracted out of the semiconductor light emitting device 119a as light L6.

On the other hand, as illustrated in FIG. 3A, a portion of light L1 of the luminescent light emitted from the light emitting layer 30 reflects at an interface 51 between the second semiconductor layer 20 and the transparent conductive layer 50 and is extracted out of the semiconductor light emitting device 110 as light L2. Furthermore, another portion of the luminescent light, light L3 reflects at an interface 52 between the transparent conductive layer 50 and the second electrode 80 and is extracted out of the semiconductor light emitting device 110 as light L4.

Thus, in the semiconductor light emitting device 119a of the first reference example, the luminescent light reflects at one interface, the interface 53 between the second semiconductor layer 20 and the second electrode 80. In contrast, in the semiconductor light emitting device 110 according to the embodiment, the luminescent light reflects at two interfaces, the interface 51 between the second semiconductor layer 20 and the transparent conductive layer 50 and the interface 52 between the transparent conductive layer 50 and the second electrode 80. Therefore the semiconductor light emitting device 110 according to the embodiment has higher light extraction efficiency than the semiconductor light emitting device 119a.

Figure 4:
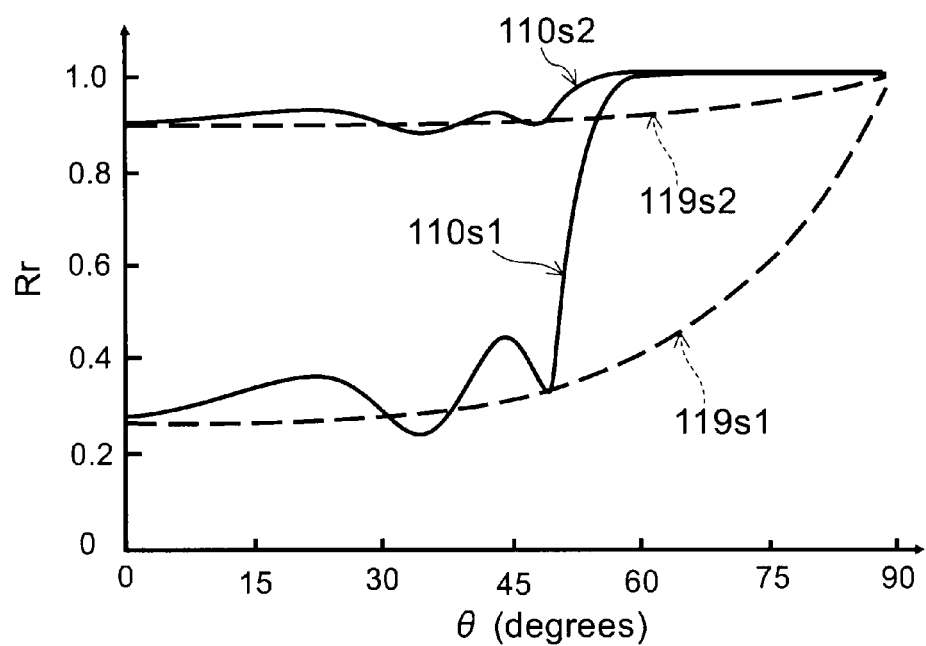
FIG. 4 is a graph illustrating the optical characteristics of semiconductor light emitting devices.

FIG. 4 is a graph illustrating the optical characteristics of semiconductor light emitting devices.

Specifically, this drawing illustrates simulation results of the optical characteristics of two-layer stacked films 119s1 and 119s2 having a metal layer and a first transparent layer stacked on the metal layer; and the optical characteristics of three-layer stacked films 110s1 and 110s2 having a metal layer, a first transparent layer, and a second transparent layer provided between the metal layer and the first transparent layer, having a refractive index lower than a refractive index of the first transparent layer. In this simulation, the refractive index of the first transparent layer was 1.78, and the refractive index of the second transparent layer was 1.46. The two-layer stacked film 119s1 and the three-layer stacked film 110s1 were used as cases where gold (Au) was used as the metal layer. The two-layer stacked film 119s2 and the three-layer stacked film 110s2 were used as cases where silver (Ag) was used as the metal layer. A wavelength of the luminescent light was assumed to be 450 nanometers (nm).

The horizontal axis of this drawing shows an angle of incidence θ (degrees) of light onto the two-layer stacked film or the three-layer stacked film and the vertical axis shows a reflectance Rr.

The two-layer stacked films 119s1 and 119s2 correspond to the semiconductor light emitting device 119a of the first reference example and the three-layer stacked films 110s1 and 110s2 correspond to the semiconductor light emitting device 110 according to the embodiment.

As illustrated in FIG. 4, when the metal layer is Au, the reflectance Rr of the two-layer stacked film 119s1 is about 0.3 at the angle of incidence θ of 0 degrees and the reflectance Rr gradually increases as the angle of incidence θ increases. When the metal layer is Au, the reflectance Rr of the three-layer stacked film 110s1 is substantially the same as in the two-layer stacked film 119s1 at the angle of incidence θ of 0 degrees, but when the angle of incidence θ is at or above 50 degrees, the reflectance Rr increases rapidly and becomes substantially 1. Thus, for the three-layer stacked film 110s1, when the angle of incidence θ is at or above 50 degrees, the reflectance Rr is significantly improved over the two-layer stacked film 119s1.

Additionally, as illustrated in FIG. 4, even in a case where the metal layer is Ag in the three-layer stacked film 110s2, when the angle of incidence θ is at or above 50 degrees, the reflectance Rr is improved over the two-layer stacked film 119s2.

Thus, a phenomenon of total reflection caused by a difference in the refractive indices between the first transparent layer and the second transparent layer leads to the reflectance Rr of the three-layer stacked film 110s1 improving over the two-layer stacked film 119s1.

In the semiconductor light emitting device 110 according to the embodiment, this phenomenon is utilized. Specifically, in addition to the reflection at the interface 52 between the transparent conductive layer 50 and the second electrode 80, the reflection via, for example, total reflection at the interface 51 between the second semiconductor layer 20 and the transparent conductive layer 50 is utilized. Thereby, high light extraction efficiency is obtained.

Figure 5A:
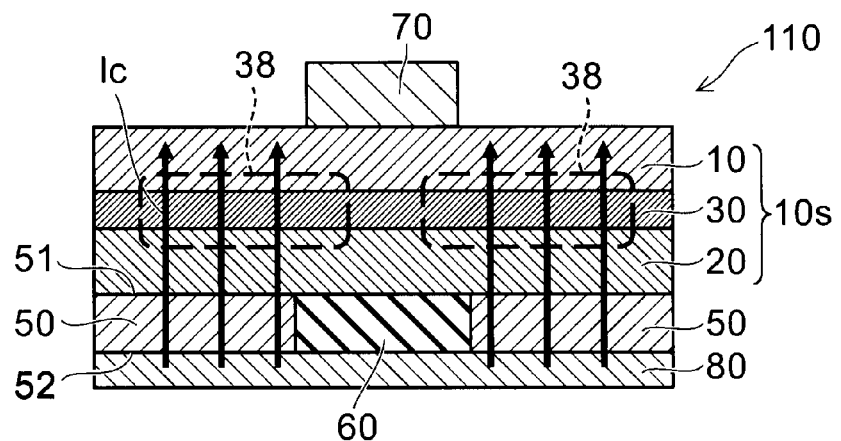
FIG. 5A and FIG. 5B are schematic cross-sectional views illustrating operations of semiconductor light emitting devices.
Figure 5B:
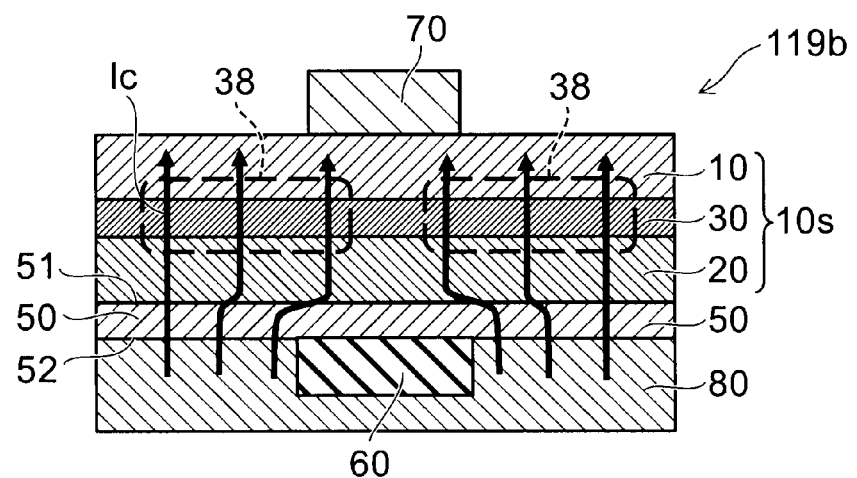

FIG. 5A and FIG. 5B are schematic cross-sectional views showing operations of semiconductor light emitting devices. Specifically, FIG. 5A illustrates an electrical operation in the semiconductor light emitting device 110 according to the embodiment and FIG. 5B illustrates an electrical operation in a semiconductor light emitting device 119b of a second reference example.

As illustrated in FIG. 5B, in a semiconductor light emitting device 119b of the second reference example, the transparent conductive layer 50 is provided between the second electrode 80 and the second semiconductor layer 20 and between the high resistance layer 60 and the second semiconductor layer 20. In the semiconductor light emitting device 119b, current Ic flowing from the second electrode 80 toward the first semiconductor layer 10 spreads in a lateral direction (a direction perpendicular to the Z-axis direction) in the transparent conductive layer 50. As a result, the current Ic also flows into a region where the high resistance layer 60 and the first electrode 70 mutually oppose. Therefore, in the light emitting layer 30, a light emitting region 38 emitting light by the current Ic overlaps with the region where the high resistance layer 60 and the first electrode 70 mutually oppose. Light emitted at the region where the high resistance layer 60 and the first electrode 70 mutually oppose is blocked by the first electrode 70 and, therefore, is not directly extracted out. As a result, in the semiconductor light emitting device 119b of the second reference example, light extraction efficiency is low.

In contrast, as illustrated in FIG. 5A, in the semiconductor light emitting device 110 according to the embodiment, the current Ic substantially does not flow in a region where the high resistance layer 60 is provided. Specifically, the current Ic flows from the second electrode 80 toward the first semiconductor layer 10 without spreading in the lateral direction (the direction perpendicular to the Z-axis direction). Therefore, the light emitting region 38 emitting light by the current Ic substantially does not overlap with the region where the high resistance layer 60 and the first electrode 70 mutually oppose. In other words, a configuration can be realized in which light is substantially not emitted at the region where the high resistance layer 60 and the first electrode 70 mutually oppose and light is blocked by the first electrode 70. As a result, in the semiconductor light emitting device 110, light extraction efficiency is high.

In the second reference example, because the transparent conductive layer 50 is provided, the reflection at the interface 52 between the transparent conductive layer 50 and the second electrode 80 and the reflection at the interface 51 between the second semiconductor layer 20 and the transparent conductive layer 50 can be utilized. Therefore, optically, it is possible to obtain a higher light extraction efficiency than that in the first reference example. However, in the second reference example, the transparent conductive layer 50 is provided between the high resistance layer 60 and the second semiconductor layer 20. Therefore, the current Ic spreads in the lateral direction and light is emitted at the region blocked by the first electrode 70, leading to a loss of light.

In contrast, in the semiconductor light emitting device 110 according to the embodiment, the reflection at the interface 52 between the transparent conductive layer 50 and the second electrode 80 and the reflection at the interface 51 between the second semiconductor layer 20 and the transparent conductive layer 50 can be utilized. Therefore, optically, a high light extraction efficiency can be obtained, because the high resistance layer 60 is in contact with the second semiconductor layer 20 and the transparent conductive layer 50 is juxtaposed with the high resistance layer 60. At the same time, the current Ic does not spread and light emitting at the region blocked by the first electrode 70 can be suppressed. As a result, the loss of light can be suppressed and a semiconductor light emitting device having high light extraction efficiency can be provided. Specifically, a semiconductor light emitting device having high efficiency can be provided due to the reflection by the interfaces of the transparent conductive layer 50 and the suppressing of the current Ic by the high resistance layer 60.

In this embodiment, a thickness of the high resistance layer 60 is preferably not less than 50 nanometers (nm) and not more than 200 nm. If the thickness of the high resistance layer 60 is less than 50 nm, blockability of the current Ic by the high resistance layer 60 may decrease, which may lead to a decrease in the degree of suppressing the current Ic. If the thickness of the high resistance layer 60 exceeds 200 nm, the flatness of the second electrode 80 may degrade, which may lead to a weakening of the bonding between the first conductive layer 91 and the second conductive layer 92, described hereinafter. However, this embodiment is not limited thereto, and the thickness of the high resistance layer 60 may be set as desired.

Hereinafter, an example of a manufacturing method of the semiconductor light emitting device 110 will be described.

Figure 6A:
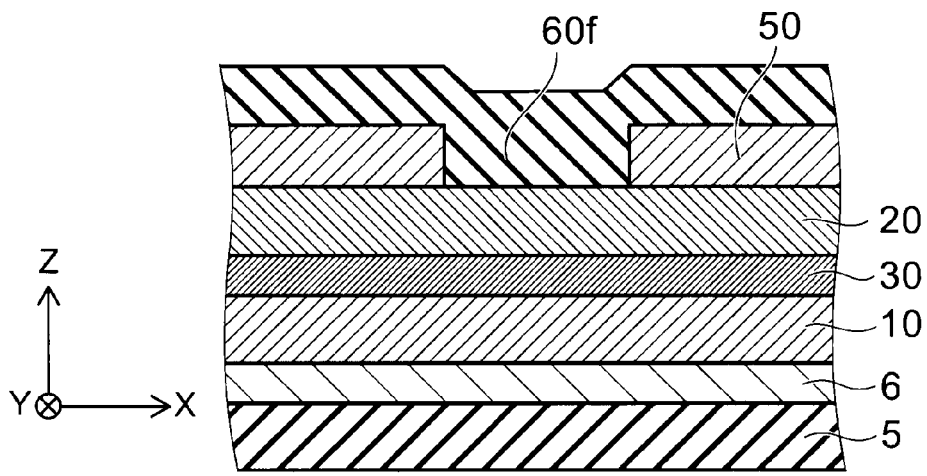
FIG. 6A to FIG. 6C are sequential schematic cross-sectional views illustrating a manufacturing method of the semiconductor light emitting device according to the embodiment.
Figure 6B:
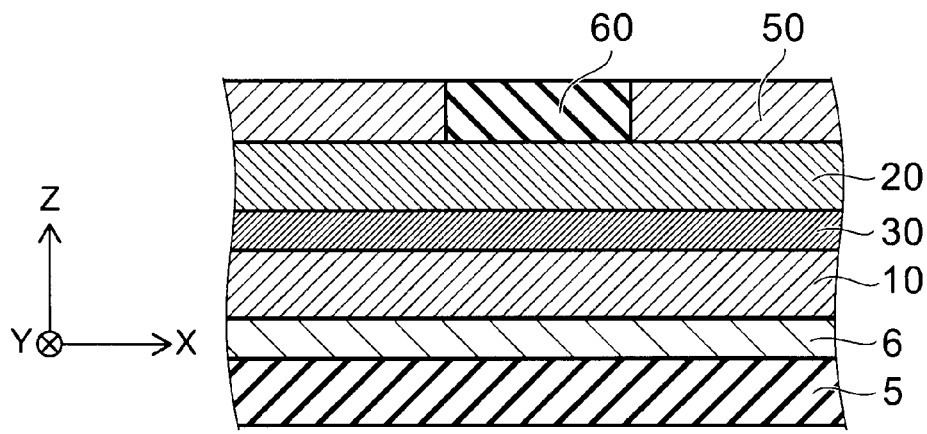
Figure 6C:
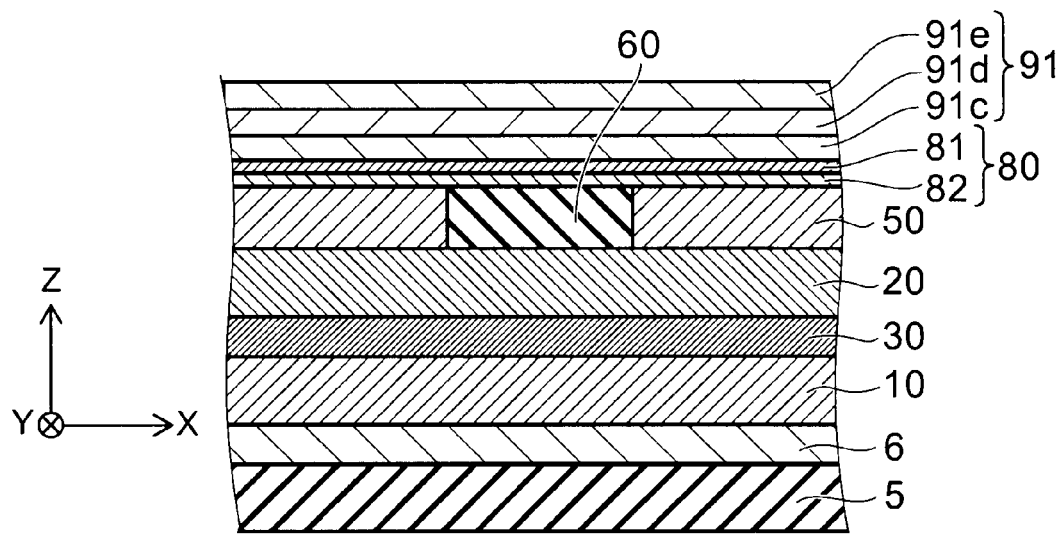

FIG. 6A to FIG. 6C are sequential schematic cross-sectional views illustrating a manufacturing method of a semiconductor light emitting device according to the first embodiment.

Figure 7A:
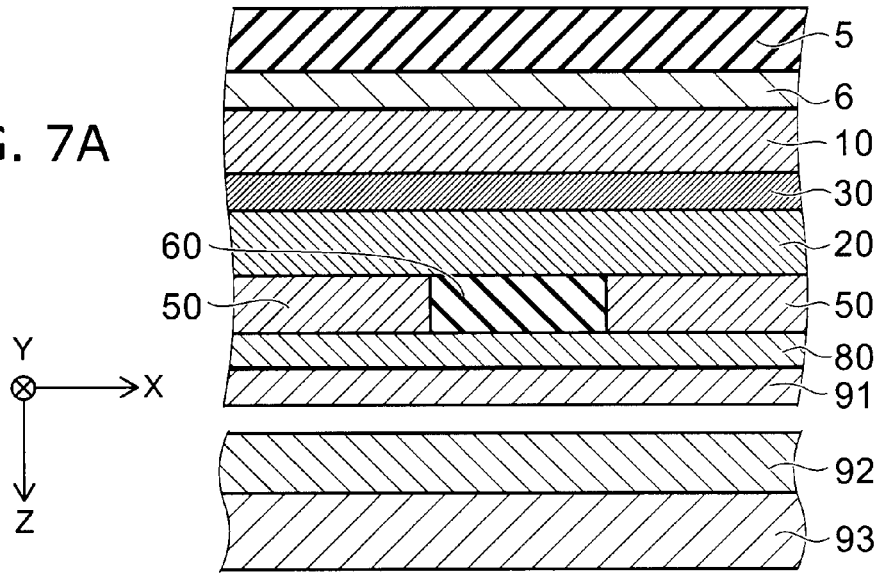
FIG. 7A to FIG. 7C are sequential schematic cross-sectional views illustrating a manufacturing method of the semiconductor light emitting device according to the embodiment.
Figure 7B:
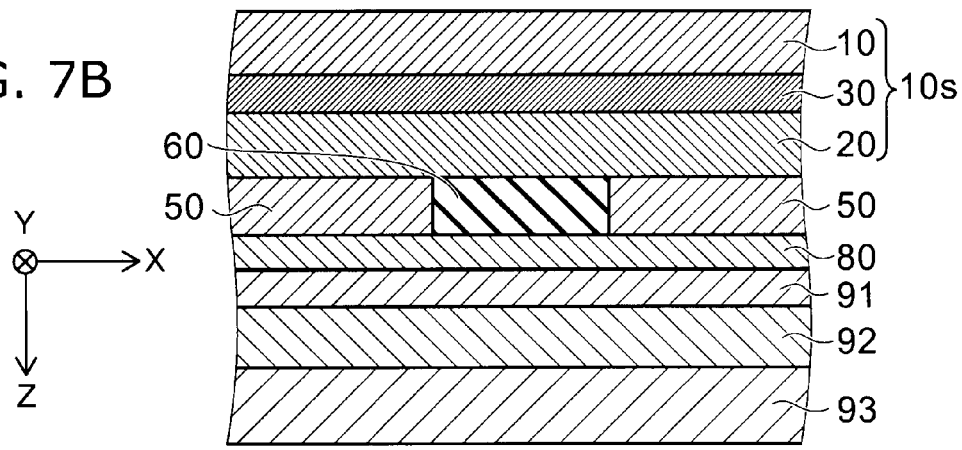
Figure 7C:
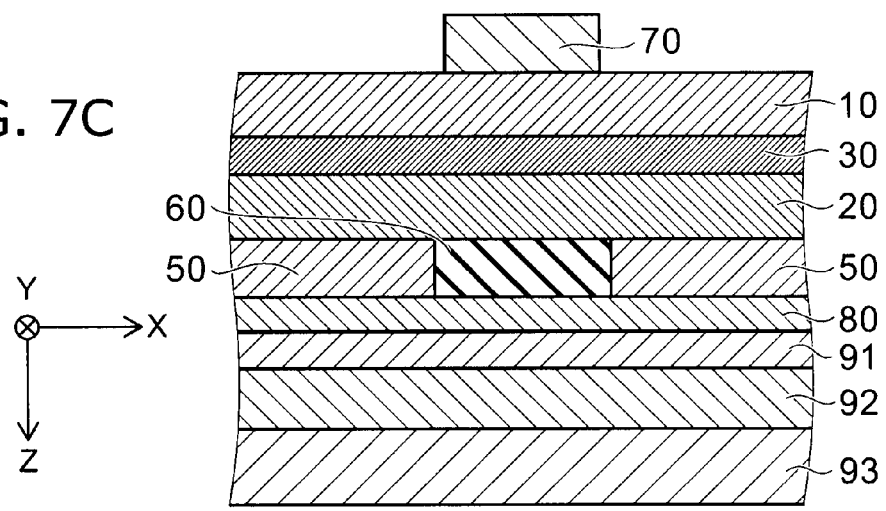

FIG. 7A to FIG. 7C are sequential schematic cross-sectional views illustrating a manufacturing method of a semiconductor light emitting device according to the first embodiment.

In the following manufacturing method, metal organic chemical vapor deposition (MOCVD), for example, is used to grow the crystals of the semiconductor layers. Aside from this, molecular beam epitaxy (MBE) may also be used to grow the crystals.

As illustrated in FIG. 6A, a buffer layer 6 is formed on a major surface of a substrate 5 that is made of sapphire or the like. Aside from sapphire, various materials such as GaN, SiC, Si, GaAs, and the like may be used for the substrate 5. An $Al_{x0}Ga_{1-x0}N$ ($0 \leq x0 \leq 1$) layer may, for example, be used as the buffer layer 6. A crystal of the first semiconductor layer 10 is grown on the buffer layer 6. An n-type GaN layer may, for example, be used for the first semiconductor layer 10. A crystal of the light emitting layer 30 is grown on the first semiconductor layer 10. The various configurations described in relation to FIG. 2A to FIG. 2C are applied to the light emitting layer 30. A crystal of the second semiconductor layer 20 is grown on the light emitting layer 30. A p-type GaN layer may, for example, be used for the second semiconductor layer 20.

The transparent conductive layer 50 is formed by, for example, forming an ITO film on the second semiconductor layer 20 and processing the ITO film into a predetermined shape. Wet etching may, for example, be used for this processing. An insulating film 60f that will become the high resistance layer 60 is formed on the transparent conductive layer 50 and on the second semiconductor layer 20 that is exposed from the transparent conductive layer 50. Silicon oxide may, for example, be used as the insulating film 60f. Chemical vapor deposition (CVD) may, for example, be used for the forming of the insulating film 60f.

As illustrated in FIG. 6B, the insulating film 60f is polished and flattened, and a surface of the transparent conductive layer 50 is exposed. Thereby, the high resistance layer 60 is formed.

As illustrated in FIG. 6C, the second electrode 80 is formed on the high resistance layer 60 and the transparent conductive layer 50. An Ag layer is used as the second electrode 80. In this example, the second electrode 80 further includes a Ni layer that is provided on the Ag layer. Specifically, the second electrode 80 may include a first metal layer 81 (i.e. a Ni layer), and a second metal layer 82 (Ag layer) that is provided between the first metal layer 81 and the high resistance layer 60 and between the first metal layer 81 and the transparent conductive layer 50, and which has a higher reflectance with respect to the luminescent light than the first metal layer 81. The first metal layer 81 functions, for example, as a barrier metal layer and, is, for example, formed from nickel or the like.

Furthermore, the first conductive layer 91 is formed on the second electrode 80. Specifically, a third metal layer 91c is formed on the second electrode 80, a fourth metal layer 91d is formed on the third metal layer 91c, and a fifth metal layer 91e is formed on the fourth metal layer 91d. A Ti layer is, for example, used as the third metal layer 91c, a Pt layer is, for example, used as the fourth metal layer 91d, and an Au layer is, for example, used as the fifth metal layer 91e.

As illustrated in FIG. 7A, the second conductive layer 92 that is provided on the major surface of the conductive substrate 93 and the first conductive layer 91 are disposed so as to be mutually opposing. A layer including Au and Sn is used as the second conductive layer 92. In the second conductive layer 92 and the first conductive layer 91 in a contacted state, pressure is applied for a predetermined amount of time at, for example, a high-temperature of 250° C. or higher.

Thereby, as illustrated in FIG. 7B, the first conductive layer 91 and the second conductive layer 92 are mutually bonded.

Then a UV light laser (i.e. a laser having a KrF wavelength of 248 nm) is used to pulse irradiate from a side of the substrate 5 opposite to the first semiconductor layer 10.

Thereby, as illustrated in FIG. 7B, the stacked structural body 10s is removed from the substrate 5. Thus, by removing the substrate 5 used in the forming of the stacked structural body 10s, heat dissipation can be improved in the semiconductor light emitting device 110 and high luminous efficacy can be obtained.

Thereafter, the stacked structural body 10s is processed into a predetermined shape. Specifically, a plurality of the stacked structural bodies 10s are formed on the substrate 5 and each of the plurality of the stacked structural bodies 10s are individually isolated. At this time, the first metal layer 81 is exposed between each of the isolated plurality of the stacked structural bodies 10s. In the stacked structural body 10s, for example, an area in an X-Y plane of the stacked structural body 10s increases from the first semiconductor layer 10 toward the second semiconductor layer 20. In other words, a side wall of the stacked structural body 10s forms a tapered mesa shape, inclined in the Z-axis direction.

A silicon oxide film (not shown) is formed as a protective layer so as to cover the stacked structural body 10s and the first metal layer 81. Coverage of the protective layer is improved due to the mesa shape of the stacked structural body 10s. The protective layer may be provided as necessary, and, in certain cases, may be omitted.

A portion of the protective layer covering a top surface of the first semiconductor layer 10 (the surface of the side opposite the second semiconductor layer 20) is removed and the first semiconductor layer 10 is exposed. Etching is performed on the first semiconductor layer 10 for 15 minutes using potassium hydroxide at a concentration of 1 mol/liter (mol/l) and at a temperature of 70° C. As a result, the top surface of the first semiconductor layer 10 is roughened. The roughening of the first semiconductor layer 10 described above is performed as necessary and, in certain cases, may be omitted.

As illustrated in FIG. 7C, the first electrode 70 is formed on the first semiconductor layer 10 (the side opposite to the second semiconductor layer 20). Specifically, a conductive film that will become the first electrode 70 is formed on the first semiconductor layer 10, and this conductive film is processed so as to have a portion that overlaps with the high resistance layer 60 when viewed along the Z-axis direction from the first semiconductor layer 10 toward the second semiconductor layer 20.

Thus, the method according to the embodiment may further include making the surface of the first semiconductor layer 10 roughened. The order of the forming of the first electrode 70 and the roughening of the first semiconductor layer 10 may be mutually reversed. A material including any one selected from the group consisting of, for example, Pt, Au, Ni, and Ti may be used for the first electrode 70. However, in this embodiment, any conductive material may be used for the first electrode 70.

The semiconductor light emitting device 110 illustrated in FIG. 1A and FIG. 1B can be produced through such a process as that described above.

As illustrated in FIG. 1B, in the semiconductor light emitting device 110, a periphery 70p of the first electrode 70 when viewed along the Z-axis direction is positioned on an inner side of a periphery of the high resistance layer 60 when viewed along the Z-axis direction. As a result, the current Ic passing in the region covered by the first electrode 70 in the light emitting layer 30 is suppressed and it becomes easy to improve efficiency.

An area of the high resistance layer 60 is smaller than an area of the transparent conductive layer 50. Specifically, it is sufficient that the high resistance layer 60 is able to suppress the current Ic passing a region of the second semiconductor layer 20 corresponding to the first electrode 70. By making the area of the high resistance layer 60 smaller than the area of the transparent conductive layer 50, an area where the current Ic flows can be made large, or, in other words, the light emitting region 38 can be set so as to be large. Thereby, efficiency can be further improved.

In the semiconductor light emitting device 110, a distance between a face 80a (a first face) of the first electrode 70 side of a portion of the second electrode 80 opposing the first electrode 70 and the second semiconductor layer 20 is the same as a distance between a face 80b (a second face) of the first electrode 70 side of a portion of the second electrode 80 not opposing the first electrode 70 and the second semiconductor layer 20. Thus, the second electrode 80 has the first face on the first electrode 70 side. The first face opposes the first electrode 70. Further, the second electrode 80 has the second face on the first electrode 70 side. The second face does not oppose the first electrode 70.

In other words, in this example, a distance between a face 60a of the second electrode 80 side of the high resistance layer 60 and the second semiconductor layer 20 is the same as a distance between a face 50a of the second electrode 80 side of the transparent conductive layer 50 and the second semiconductor layer 20. The face 60a of the second electrode 80 side of the high resistance layer 60 and the face 50a of the second electrode 80 side of the transparent conductive layer 50 are positioned within the common plane. The face 60a and the face 50a are flat.

Thereby, flattening of the second electrode 80 side opposite to the second semiconductor layer 20 is facilitated, and bonding the first conductive layer 91 on the second electrode 80 and the second conductive layer 92 can be more stably performed.

Figure 8A:
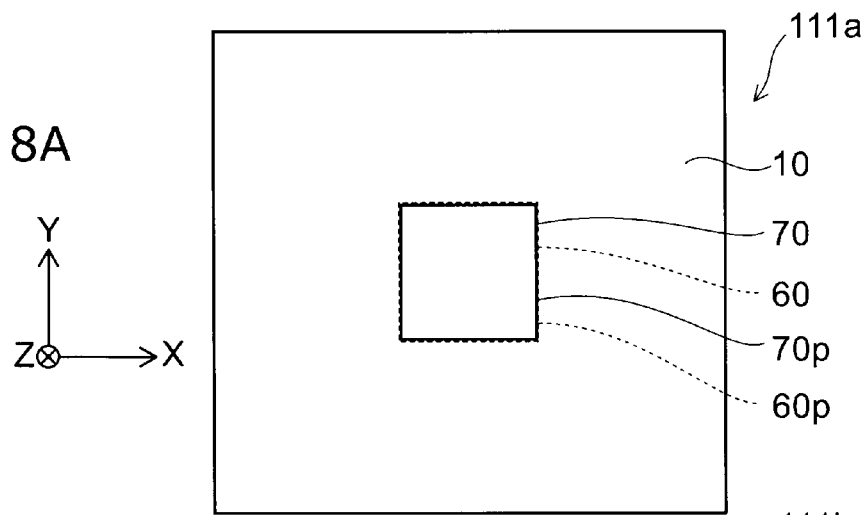
FIG. 8A to FIG. 8C are schematic plan views illustrating other semiconductor light emitting devices according to the embodiment.
Figure 8B:
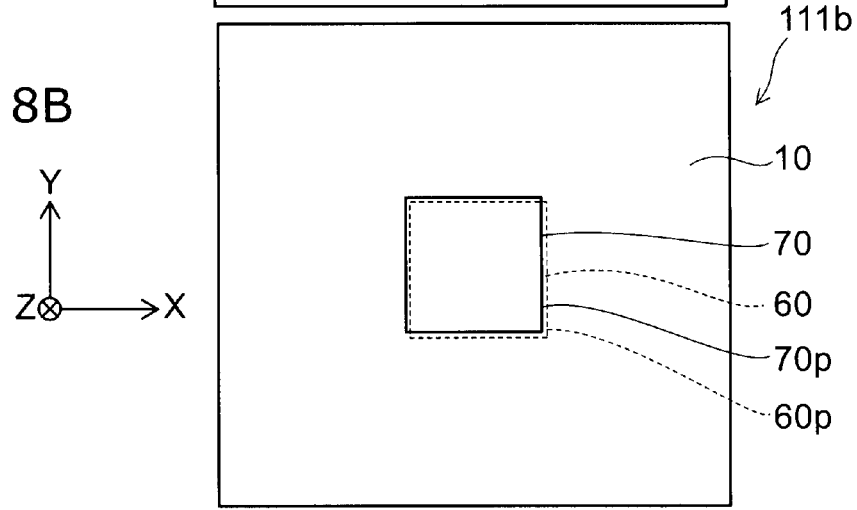
Figure 8C:
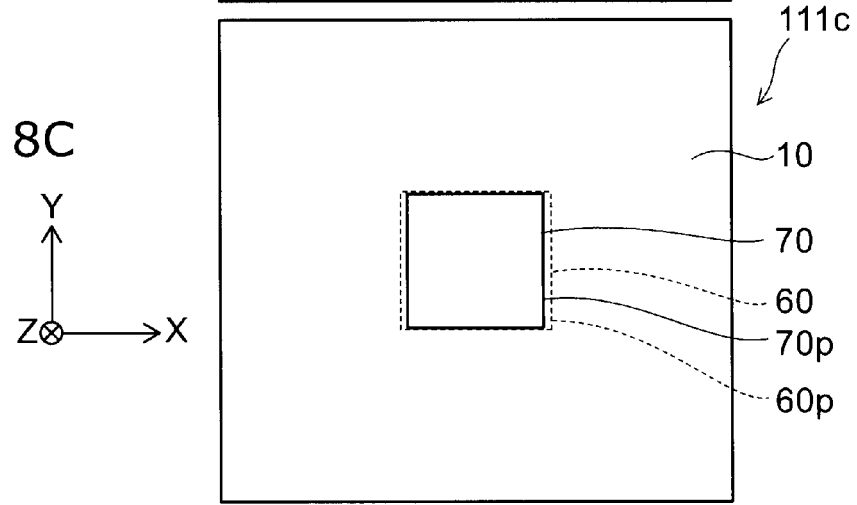

FIG. 8A to FIG. 8C are schematic plan views illustrating other configurations of the semiconductor light emitting device according to the first embodiment.

As illustrated in FIG. 8A, in a semiconductor light emitting device 111a according to the embodiment, a position in the X-Y plane of the periphery 70p of the first electrode 70 when viewed along the Z-axis direction is substantially coincident with a position in the X-Y plane of a periphery 60p of the high resistance layer 60 when viewed along the Z-axis direction.

As illustrated in FIG. 8B, in a semiconductor light emitting device 111b according to the embodiment, the position in the X-Y plane of the periphery 70p of the first electrode 70 when viewed along the Z-axis direction differs from the position in the X-Y plane of the periphery 60p of the high resistance layer 60 when viewed along the Z-axis direction. In this case as well, the high resistance layer 60 has a portion that overlaps with the first electrode 70 when viewed along the Z-axis direction.

As illustrated in FIG. 8C, in a semiconductor light emitting device 111c according to the embodiment, a position along the Y-axis direction of the periphery 70p of the first electrode 70 when viewed along the Z-axis direction is substantially coincident with a position along the Y-axis direction of the periphery 60p of the high resistance layer 60 when viewed along the Z-axis direction. Additionally, a position along the X-axis direction of the periphery 70p of the first electrode 70 when viewed along the Z-axis direction differs from a position along the X-axis direction of the periphery 60p of the high resistance layer 60 when viewed along the Z-axis direction. Thus, one position of the periphery 70p may be coincident with the position of the periphery 60p and one of other positions of the periphery 70p may differ from the position of the periphery 60p.

In FIG. 8A to FIG. 8C, the first electrode 70 and the high resistance layer 60 may be any desired polygonal shape and may have a desired shape for a plane shape including curved profiles including flat-circular and circular shapes. In this cases as well, the position in the X-Y plane of the periphery 70p of the first electrode 70 when viewed along the Z-axis direction and the position in the X-Y plane of the periphery 60p of the high resistance layer 60 when viewed along the Z-axis direction may be modified variously.

Figure 9A:
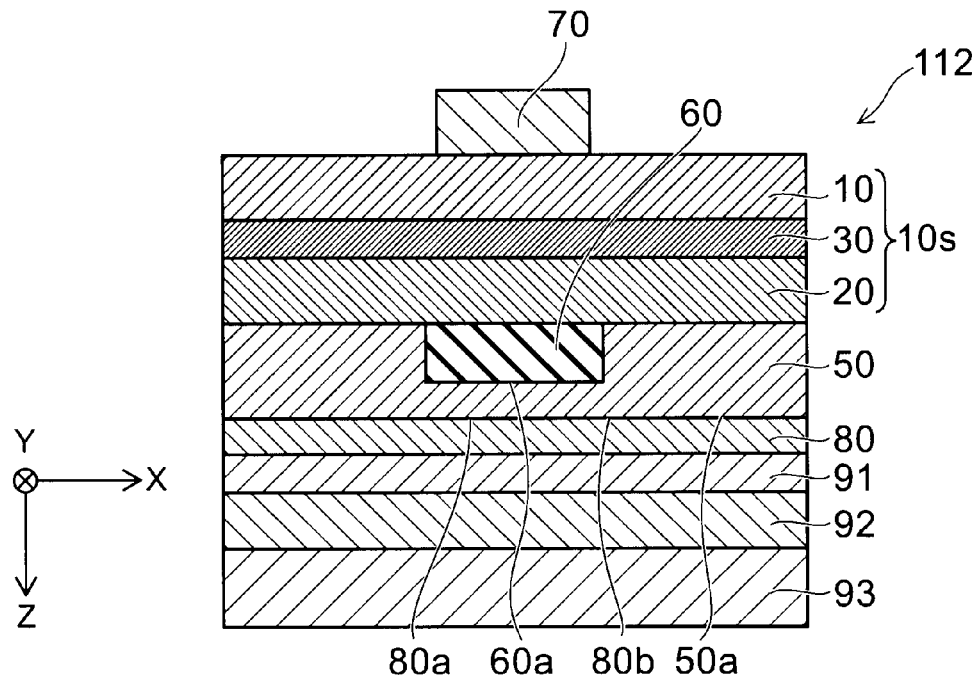
FIG. 9A and FIG. 9B are schematic cross-sectional views illustrating other semiconductor light emitting devices according to the embodiment.
Figure 9B:
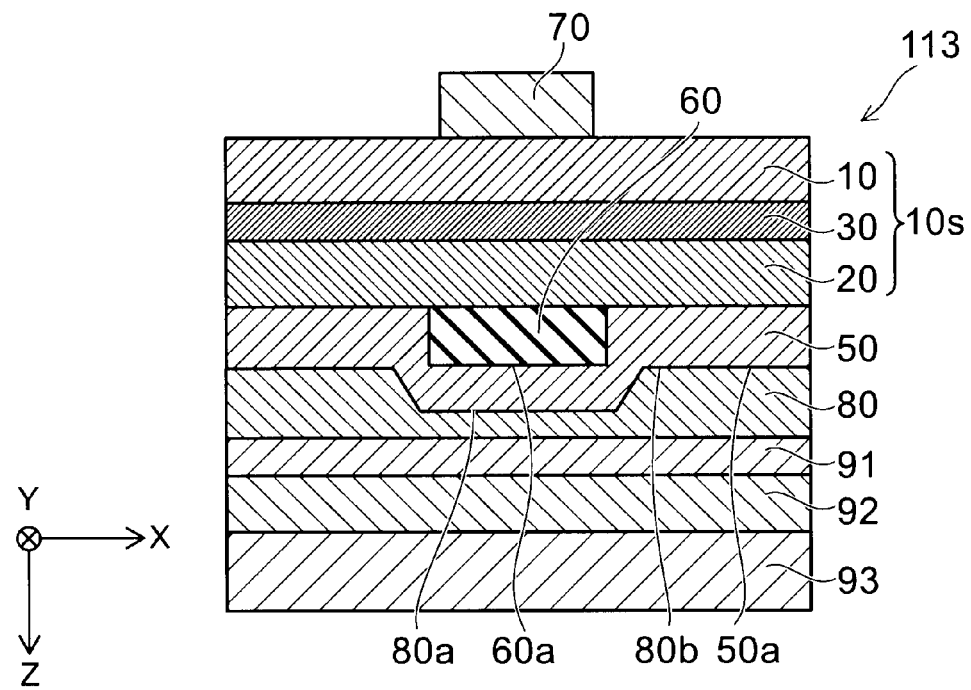

FIG. 9A and FIG. 9B are schematic cross-sectional views illustrating other configurations of the semiconductor light emitting device according to the first embodiment.

As illustrated in FIG. 9A, in the semiconductor light emitting device 112 according to the embodiment, a portion of the transparent conductive layer 50 extends between the high resistance layer 60 and the second electrode 80. In this way, it is sufficient that the high resistance layer 60 and the transparent conductive layer 50, respectively, are in contact with the second semiconductor layer 20, and as long as an electrical connection between the second semiconductor layer 20 and the second electrode 80 is obtained, a shape of the transparent conductive layer 50 may be selected as desired.

In the semiconductor light emitting device 112 as well, the distance between the face 80a of the first electrode 70 side of a portion of the second electrode 80 opposing the first electrode 70 and the second semiconductor layer 20 is the same as the distance between the face 80b of the first electrode 70 side of a portion of the second electrode 80 not opposing the first electrode 70 and the second semiconductor layer 20.

As illustrated in FIG. 9B, in the semiconductor light emitting device 113 according to the embodiment, a portion of the transparent conductive layer 50 extends between the high resistance layer 60 and the second electrode 80. Moreover, in this case, the distance between the face 80a of the first electrode 70 side of the portion of the second electrode 80 opposing the first electrode 70 and the second semiconductor layer 20 is greater than the distance between the face 80b of the first electrode 70 side of the portion of the second electrode 80 not opposing the first electrode 70 and the second semiconductor layer 20. In other words, there is a step in the surfaces (the face 80a and the face 80b) of the first electrode 70 side of the second electrode 80. In this case as well, a highly efficient semiconductor light emitting device can be provided.

However, the case where the surface of the second electrode 80 opposite to the second semiconductor layer 20 is flat is more preferable because the bonding of the first conductive layer 91 and the second conductive layer 92 can be more stably performed.

Second Embodiment

A second embodiment relates to a manufacturing method of a semiconductor light emitting device.

Figure 10:
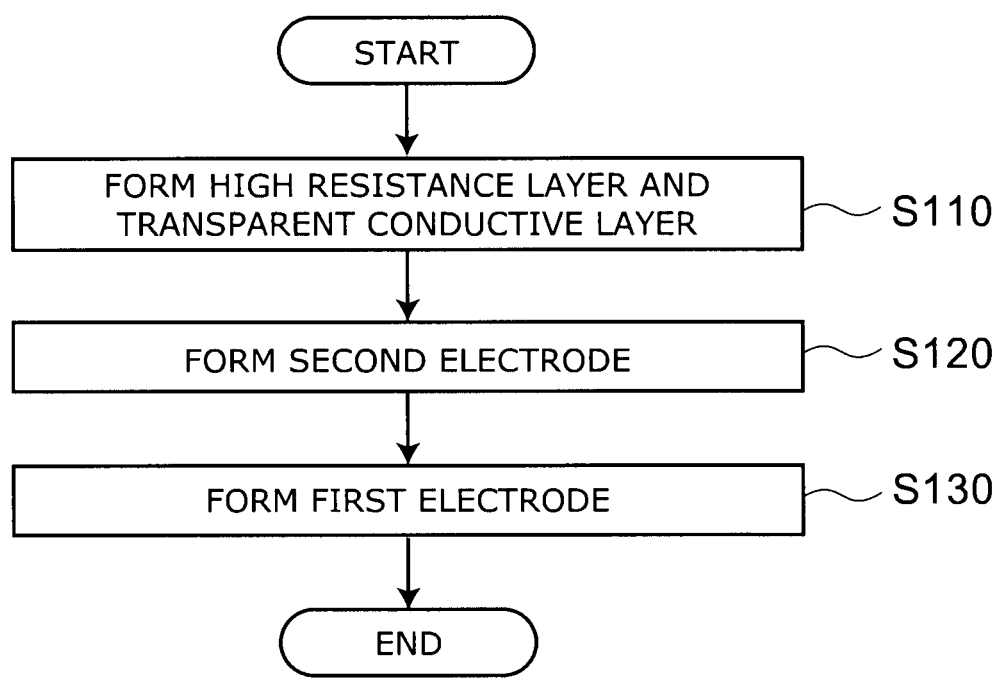
FIG. 10 is a flowchart illustrating a manufacturing method of a semiconductor light emitting device according to an embodiment.

FIG. 10 is a flowchart illustrating a manufacturing method of a semiconductor light emitting device according to the second embodiment.

As illustrated in FIG. 10, in the manufacturing method of a semiconductor light emitting device according to the embodiment, the high resistance layer 60 and the transparent conductive layer 50 are formed on a surface of the second semiconductor layer 20 side of the stacked structural body 10s opposite to the light emitting layer 30, the stacked structural body 10s including the first semiconductor layer 10 of a first conductivity type, the second semiconductor layer 20 of a second conductivity type, and the light emitting layer 30 provided between the first semiconductor layer 10 and the second semiconductor layer 20 (step S110).

The high resistance layer 60 has a resistance higher than a resistance of the second semiconductor layer 20. The transparent conductive layer 50 is transparent with respect to the luminescent light emitted from the light emitting layer 30, has a refractive index lower than a refractive index of the second semiconductor layer 20, and has a resistance lower than a resistance of the high resistance layer 60.

In this manufacturing method, the second electrode 80, that has reflectivity with respect to luminescent light emitted from the light emitting layer 30, is formed on the high resistance layer 60 and the transparent conductive layer 50 (step S120).

In this manufacturing method, the first electrode 70, that has the portion that overlaps with the high resistance layer 60 when viewed along the Z-axis direction from the first semiconductor layer 10 toward the second semiconductor layer 20, is formed on a surface of the first semiconductor layer 10 side opposite to the light emitting layer 30.

In other words, the processing described in relation to, for example, FIG. 6A to FIG. 6C and FIG. 7A to FIG. 7C is performed. Thereby, control of the reflectance at the interfaces of the transparent conductive layer 50 and the current Ic by the high resistance layer 60 becomes possible, and a highly efficient semiconductor light emitting device can be produced.

Figure 11A:
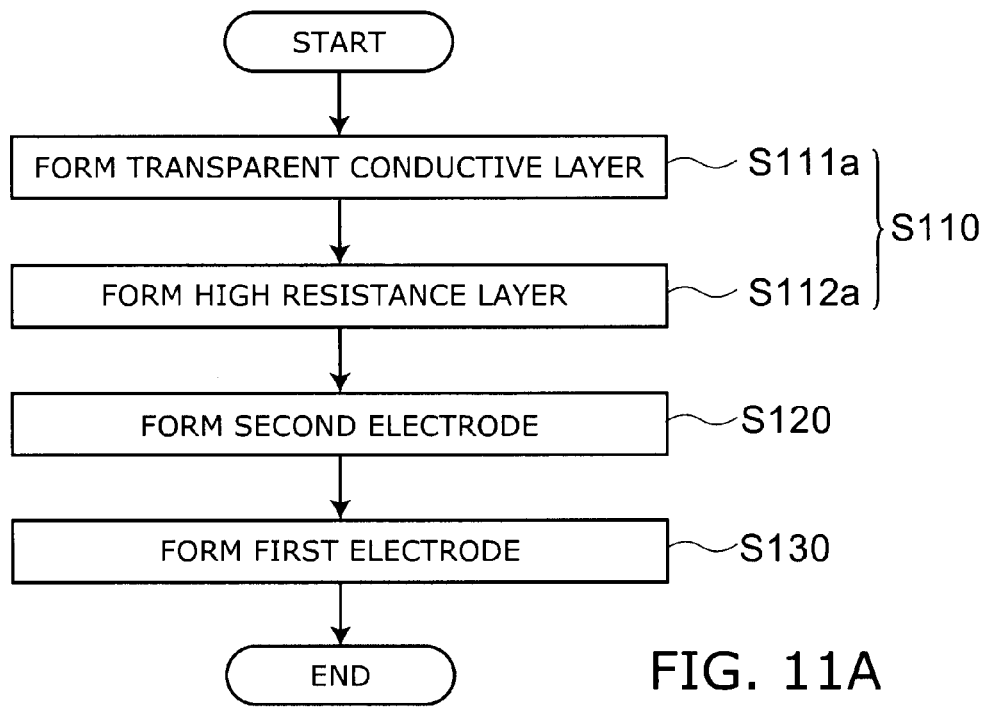
FIG. 11A and FIG. 11B are flowcharts illustrating manufacturing methods of a semiconductor light emitting device according to the embodiment.
Figure 11B:
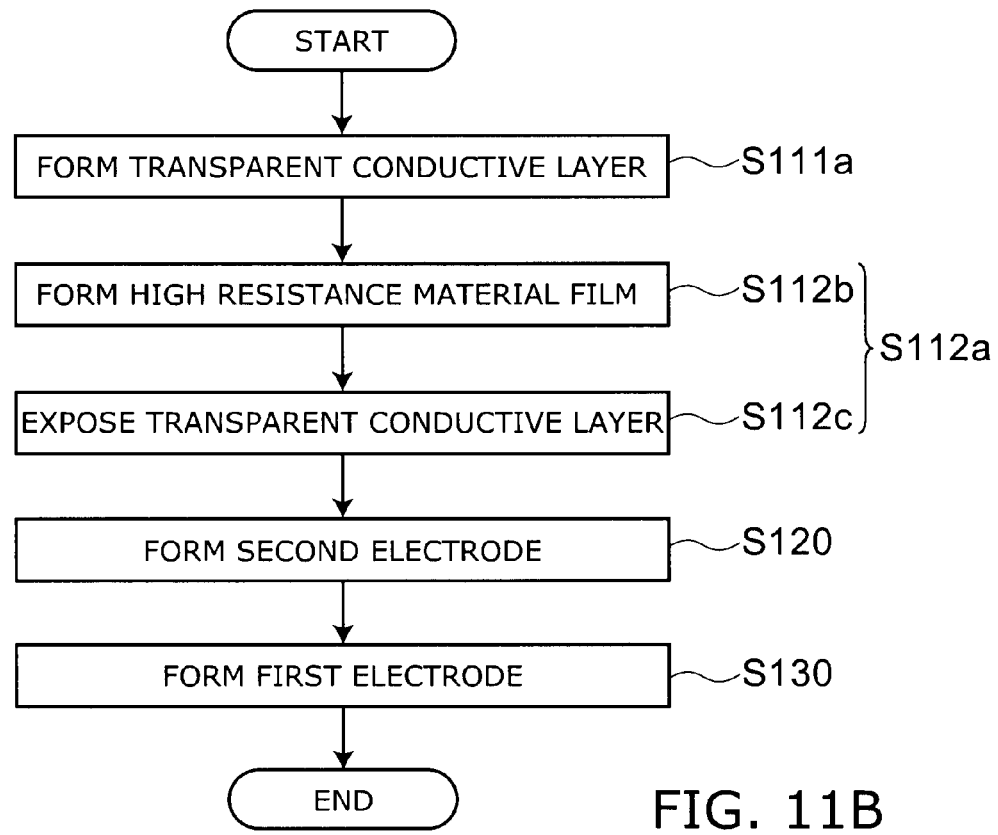

FIG. 11A and FIG. 11B are flowcharts illustrating other manufacturing methods of a semiconductor light emitting device according to the second embodiment.

In the methods illustrated in FIG. 11A and FIG. 11B, the high resistance layer 60 is formed after the forming the transparent conductive layer 50.

Specifically, as illustrated in FIG. 11A, the forming of the high resistance layer 60 and the transparent conductive layer 50 (step S110) includes the forming of the transparent conductive layer 50 on a portion of the surface of the second semiconductor layer 20 side opposite to the light emitting layer 30 (step S111a).

Step S110 includes forming the high resistance layer 60 on the surface of the second semiconductor layer 20 side opposite to the light emitting layer 30 where the transparent conductive layer 50 is not provided (step S112a) after the forming of the transparent conductive layer 50. In other words, the processing described in relation to FIG. 6A is performed.

As illustrated in FIG. 11B, the forming of the high resistance layer 60 (step S112a) includes forming a high resistance material film (step S112b) on the surface of the second semiconductor layer 20 side opposite to the light emitting layer 30 where the transparent conductive layer 50 is not provided, and on the transparent conductive layer 50; and polishing the high resistance material film and exposing the transparent conductive layer 50 (step S112c).

In the above described method, the forming of the transparent conductive layer 50 and the forming of the high resistance layer 60 may be performed using a desired technique. After the film that will become the transparent conductive layer 50 or the high resistance layer 60 is formed, the transparent conductive layer 50 or the high resistance layer 60 can be formed by photolithography and etching. Additionally, a lift-off method may also used.

Figure 12:
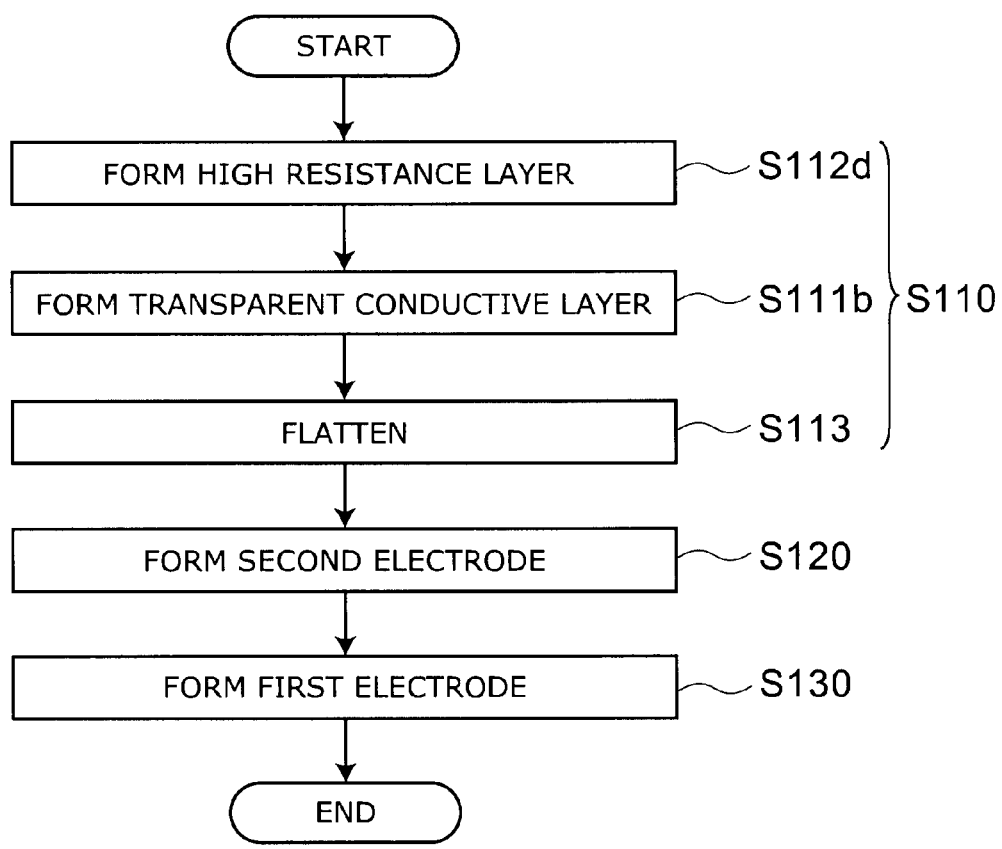
FIG. 12 is a flowchart illustrating a manufacturing method of a semiconductor light emitting device according to the embodiment.

FIG. 12 is a flowchart illustrating another manufacturing method of a semiconductor light emitting device according to the second embodiment.

As illustrated in FIG. 12, in this manufacturing method, the forming of the high resistance layer 60 and the transparent conductive layer 50 (step S110) includes the forming of the high resistance layer 60 on the portion of the surface of the second semiconductor layer 20 side opposite to the light emitting layer 30 (step S112d).

Moreover, step S110 further includes the forming of the transparent conductive layer 50 on the surface of the second semiconductor layer 20 side opposite to the light emitting layer 30 where the high resistance layer 60 is not provided (step S111b) after the forming of the high resistance layer 60.

Thereby, for example, the semiconductor light emitting device 113 illustrated in FIG. 9B can be manufactured.

As illustrated in FIG. 12, in this manufacturing method, step S110 may further include the polishing and flattening of the transparent conductive layer 50 (step S113). Thereby, this is more preferable because the distance between the face 80a of the first electrode 70 side of the portion of the second electrode 80 opposing the first electrode 70 and the second semiconductor layer 20 can be made the same as the distance between the face 80b of the first electrode 70 side of the portion of the second electrode 80 not opposing the first electrode 70 and the second semiconductor layer 20; and the bonding of the first conductive layer 91 and the second conductive layer 92 can be more stably performed.

According to this embodiment, a highly efficient semiconductor light emitting device and method for manufacturing the same can be provided.

Note that in this specification, the term, "nitride semiconductor" includes semiconductors of all compositions wherein composition ratios of x, y, and z in the formula $B_xIn_yAl_zGa_{1-x-y-z}N$ fall within the respective ranges of $0 \leq x \leq 1$, $0 \leq y \leq 1$, $0 \leq z \leq 1$, and $x+y+z \leq 1$. Furthermore, with the formula described above, "nitride semiconductors" shall also be understood to include semiconductors further including class V elements other than N (nitrogen), semiconductors further including various elements added to control various physical properties such as conductivity type and the like, and semiconductors further including various elements that are included unintentionally.

In this specification, "perpendicular" and "parallel" are not used to mean perpendicular and parallel in their narrowest sense, but rather substantially perpendicular or parallel so as to take factors into account such as fluctuations in manufacturing processes and the like.

An embodiment of the invention with reference to examples was described above. However, the invention is not limited to these examples. The scope of the invention includes all cases in which, for example, a person skilled in the art could make use of publicly known information to appropriately select configuration elements such as the substrate, buffer layer, semiconductor layers, barrier layers, well layers, stacked structural body, electrodes, high resistance layer, transparent conductive layer, conductive layers and the like included in the semiconductor light emitting device provided that the obtained effects are similar. For example, the compositions, film thicknesses, and the like described in the embodiments described above are examples and various selections are possible.

Additionally, combinations of elements from two or more of the examples are also included in the scope of the invention, provided they are technically possible and do not depart from the spirit of the invention.

Beside such cases, all semiconductor light emitting devices and methods for manufacturing the same based on the embodiments of the invention described above that are obtainable through appropriate design modifications by a person skilled in the art shall be understood to fall within the scope of the invention, provided such semiconductor light emitting devices and methods for manufacturing the same do not depart from the spirit of the invention.

Furthermore, regarding the scope of the spirit of the invention, it is understood that a variety of variations and modifications could be conceived by a person skilled in the art and that these variations and modifications all fall within the scope of the invention as well.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
   a stacked structural body including a first semiconductor layer of a first conductivity type, a second semiconductor layer of a second conductivity type, and a light emitting layer provided between the first semiconductor layer and the second semiconductor layer;
   a first electrode, the first semiconductor layer being disposed between the first electrode and the second semiconductor layer;
   a second electrode, the second semiconductor layer being disposed between the second electrode and the first semiconductor layer, the second electrode having reflectivity with respect to luminescent light emitted from the light emitting layer;
   a high resistance layer being in contact with the second semiconductor layer between the second semiconductor layer and the second electrode, the high resistance layer including a portion overlapping with the first electrode when viewed along a first direction from the first semiconductor layer toward the second semiconductor layer, the high resistance layer having a resistance higher than a resistance of the second semiconductor layer; and
   a transparent conductive layer being in contact with the second semiconductor layer between the second semiconductor layer and the second electrode, the transparent conductive layer being transparent with respect to the luminescent light, the transparent conductive layer having a refractive index lower than a refractive index of the second semiconductor layer, the transparent conductive layer having a resistance lower than a resistance of the high resistance layer,
   the transparent conductive layer including a portion extending between the high resistance layer and the second electrode,
   the second electrode having a first face on a side of the first electrode, the first face opposing the first electrode, the second electrode having a second face on the side of the first electrode, the second face not opposing the first electrode, the second electrode having a third face provided between the first face and the second face, the third face being inclined with respect to the first direction,
   a distance between the first face and the second semiconductor layer being greater than a distance between the second face and the second semiconductor layer, and
   a thickness of the high resistance layer being not less than 50 nanometers and not more than 200 nanometers.

2. The device according to claim 1, wherein a periphery of the first electrode when viewed along the first direction is positioned on an inner side of a periphery of the high resistance layer when viewed along the first direction.

3. The device according to claim 1, wherein an area of the high resistance layer is smaller than an area of the transparent conductive layer.

4. The device according to claim 1, wherein the first semiconductor layer, the second semiconductor and the light emitting layer includes nitride semiconductors.

5. The device according to claim 1, wherein the first conductivity type is an n-type and the second conductivity type is a p-type.

6. The device according to claim 1, wherein the high resistance layer includes silicon oxide.

7. The device according to claim 1, wherein the first electrode includes one selected from the group consisting of Pt, Au, Ni, and Ti.

8. The device according to claim 1, wherein a portion of the luminescent light is reflected at an interface between the second semiconductor layer and the transparent conductive layer.

9. The device according to claim 1, further comprising:
   a conductive substrate, the second electrode being disposed between the conductive substrate and the second semiconductor layer; and
   a conductive layer made of metal and provided between the second electrode and the conductive substrate.

10. The device according to claim 9, wherein the conductive layer includes:
    a first conductive layer portion provided between the conductive substrate and the second electrode; and
    a second conductive layer portion provided between the conductive substrate and the first conductive layer portion,
    the first conductive layer portion and the second conductive layer portion have a function to bond the second electrode and the conductive substrate.

11. The device according to claim 9, wherein an interface between the second electrode and the conductive layer is flat.

12. The device according to claim 1, wherein the transparent conductive layer includes an oxide including at least one element selected from the group consisting of In, Sn, Zn, and Ti.

13. The device according to claim 12, wherein the second semiconductor layer includes GaN.

14. A method for manufacturing a semiconductor light emitting device including a stacked structural body including a first semiconductor layer of a first conductivity type, a second semiconductor layer of a second conductivity type, and a light emitting layer provided between the first semiconductor layer and the second semiconductor layer;

the method comprising:
forming a high resistance layer on a portion of a surface of a side of the second semiconductor layer of the stacked structural body opposite to the light emitting layer, the high resistance layer having a resistance higher than a resistance of the second semiconductor layer, a thickness of the high resistance layer being not less than 50 nanometers and not more than 200 nanometers;

forming a transparent conductive layer on the surface of the side of the second semiconductor layer opposite to the light emitting layer where the high resistance layer is not provided and on the high resistance layer, the transparent conductive layer being transparent with respect to luminescent light emitted from the light emitting layer, a refractive index of the transparent conductive layer being lower than a refractive index of the second semiconductor layer, and a resistance of the transparent conductive layer being lower than a resistance of the high resistance layer, forming a second electrode having reflectivity with respect to the luminescent light on the high resistance layer and the transparent conductive layer; and forming a first electrode having a portion overlapping with the high resistance layer when viewed along a first direction from the first semiconductor layer toward the second semiconductor layer on a surface of a side of the first semiconductor layer opposite to the light emitting layer, the forming of the transparent conductive layer including making a distance between a first face of the second electrode and the second semiconductor layer greater than a distance between a second face of the second electrode and the second semiconductor layer, the first face being on a side of the first electrode, the first face opposing the first electrode, the second face being on the side of the first electrode, the second face not opposing the first electrode, a third face provided between the first face and the second face being inclined with respect to the first direction.

15. The method according to claim 14, wherein the transparent conductive layer includes an oxide including at least one element selected from the group consisting of In, Sn, Zn, and Ti.

16. The method according to claim 14, wherein the second semiconductor layer includes GaN.

17. The method according to claim 14, further comprising making a surface of the first semiconductor layer roughened.

18. The method according to claim 14, wherein a portion of the luminescent light is reflected at an interface between the second semiconductor layer and the transparent conductive layer.

19. The method according to claim 14, further comprising:
bonding the second electrode with a conductive substrate by a conductive layer portion provided between the second electrode and the conductive substrate, and
an interface between the second electrode and the conductive layer portion is flat.

* * * * *